United States Patent
Rai et al.

(10) Patent No.: US 9,038,264 B2
(45) Date of Patent: May 26, 2015

(54) NON-UNIFORM VACUUM PROFILE DIE ATTACH TIP

(75) Inventors: Pradeep Kumar Rai, Jangipur (IN); Kim Lee Bock, Shanghai (CN); Li Wang, Shanghai (CN); JinXiang Huang, Shanghai (CN); EnYong Tai, Shanghai (CN); JianHua Wang, Shanghai (CN); King Hoo Ong, Shanghai (CN)

(73) Assignees: SanDisk Semiconductor (Shanghai) Co., Ltd., Shanghai (CN); SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/265,656

(22) PCT Filed: Feb. 28, 2011

(86) PCT No.: PCT/CN2011/071368
§ 371 (c)(1),
(2), (4) Date: Oct. 21, 2011

(87) PCT Pub. No.: WO2012/116482
PCT Pub. Date: Sep. 7, 2012

(65) Prior Publication Data
US 2012/0216396 A1   Aug. 30, 2012

(51) Int. Cl.
*B23P 19/00* (2006.01)
*H01L 21/683* (2006.01)
*H01L 23/00* (2006.01)

(52) U.S. Cl.
CPC ............ *H01L 21/6836* (2013.01); *H01L 24/75* (2013.01); *H01L 2224/32145* (2013.01); *H01L 2224/32225* (2013.01); *H01L 2224/48227* (2013.01); *H01L 2224/73265* (2013.01);
(Continued)

(58) Field of Classification Search
CPC ........... H01L 21/6836; H05K 13/0408; H04N 5/2253
USPC ................ 29/740–743, 832–834; 269/21, 49; 156/285, 379.6, 716, 730
See application file for complete search history.

(56) References Cited

U.S. PATENT DOCUMENTS

| 5,374,829 | A | * | 12/1994 | Sakamoto et al. | ........ 250/453.11 |
| 5,660,380 | A | * | 8/1997 | Reis et al. | ........ 269/21 |
| 6,889,427 | B2 | * | 5/2005 | Yee et al. | ........ 29/832 |

(Continued)

FOREIGN PATENT DOCUMENTS

| CN | 1755912 A | 4/2006 |
| CN | 101901742 A | 12/2010 |

(Continued)

OTHER PUBLICATIONS

English translation of Abstract for Publication No. CN1755912 published Apr. 5, 2006.
English translation of Abstract for Publication No. CN101901742 published Dec. 1, 2010.
International Search Report and Written Opinion dated Dec. 1, 2011 in International Patent Application No. PCT/CN2011/071368.

(Continued)

*Primary Examiner* — Minh Trinh
(74) *Attorney, Agent, or Firm* — Vierra Magen Marcus LLP

(57) ABSTRACT

A tool is disclosed for separating a semiconductor die from a tape to which the die is affixed during the wafer dicing process. The tool includes a pick-up arm for positioning a vacuum tip over a semiconductor die to be removed. The vacuum tip includes a non-uniform array of vacuum holes to grip the semiconductor wafer.

5 Claims, 12 Drawing Sheets

(52) U.S. Cl.
CPC ............... *H01L2221/68327* (2013.01); *H01L 2221/68377* (2013.01); *H01L 2221/68381* (2013.01)

(56) References Cited

U.S. PATENT DOCUMENTS

| | | | |
|---|---|---|---|
| 7,028,396 | B2 | 4/2006 | Hassan |
| 7,207,554 | B2 * | 4/2007 | Tokudome ............... 269/21 |
| 7,238,258 | B2 * | 7/2007 | Park et al. ............... 156/765 |
| 7,306,695 | B2 | 12/2007 | Kasai |
| 7,465,142 | B2 * | 12/2008 | Yoo ............... 414/416.09 |
| 7,607,647 | B2 * | 10/2009 | Zhao et al. ............... 269/21 |
| 7,632,374 | B2 | 12/2009 | Ozono et al. |
| 7,650,688 | B2 * | 1/2010 | Lee et al. ............... 29/743 |
| 2003/0060021 | A1 | 3/2003 | Kurosawa et al. |
| 2003/0115747 | A1 | 6/2003 | Schnetzler et al. |
| 2005/0274457 | A1 * | 12/2005 | Cheung et al. ............... 156/344 |
| 2010/0083494 | A1 * | 4/2010 | Lee et al. ............... 29/832 |

FOREIGN PATENT DOCUMENTS

| | | |
|---|---|---|
| JP | 2008290170 A | 12/2008 |
| KR | 20030028391 A | 4/2003 |
| TW | I283906 | 7/2007 |
| TW | 200946427 | 11/2009 |
| TW | 201001614 | 1/2010 |
| TW | 201033100 | 9/2010 |

OTHER PUBLICATIONS

English translation of Abstract and partial translation of Publication No. JP2008290170 published Dec. 4, 2008.
English translation of Abstract for Publication No. KR20030028391 published Apr. 8, 2003.
Office Action dated Apr. 24, 2013 in Korean Patent Application No. 10-2012-7007257.
Office Action dated Dec. 26, 2013 in Taiwan Patent Application No. 101106338.
English abstract for TWI283906 published Jul. 11, 2007.
English abstract for TW200946427 published Nov. 16, 2009.
English abstract for TW201001614 published Jan. 1, 2010.
English abstract for TW201033100 published Sep. 16, 2010.
Response to Office Action filed Oct. 24, 2013 in Korean Patent Application No. 10-2012-7007257.
Response to Office Action filed Jun. 24, 2014 in Taiwan Patent Application No. 101106338.
Decision of Rejection dated Feb. 27, 2014 in Korean Patent Application No. 10-2012-7007257.
Decision of Refusal of Amendment dated Jul. 3, 2014 in Korean Patent Application No. 10-2012-7007257.
Decision of Rejection dated Jul. 3, 2014 in Korean Patent Application No. 10-2012-7007257.
Demand For Appeal Against the Decision of Rejection filed Oct. 2, 2014 in Korean Patent Application No. 10-2012-7007257.
Notice of Supplement dated Oct. 22, 2014 in Korean Patent Application No. 10-2012-7007257.

* cited by examiner

NON-UNIFORM VACUUM PROFILE DIE ATTACH TIP

BACKGROUND

1. Field

Embodiments relate to a system for separating a diced semiconductor die from an adhesive tape.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a so-called three-dimensional stacked configuration. An edge view of a conventional semiconductor package 20 (without molding compound) is shown in prior art FIG. 1. Typical packages include a plurality of semiconductor die 22, 24 mounted to a substrate 26. Although not shown in FIG. 1, the semiconductor die are formed with wire bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds 30 are connected between the wire bond pads of the semiconductor die 22, 24 and the electrical leads of the substrate 26 to electrically couple the semiconductor die to the substrate. The contact pads on the substrate in turn provide an electrical path between the die and a host device. Once electrical connections between the die and substrate are made, the assembly is then typically encased in a molding compound to provide a protective package.

In order to form a semiconductor package, a die bonding process is performed where a semiconductor die is diced from a wafer, picked up from an adhesive tape and bonded to a substrate. Prior art FIG. 2 shows a wafer 40 including a plurality of semiconductor die, for example die 22 (only some of which are numbered in FIG. 2). Each semiconductor die 22 on wafer 40 has been processed to include an integrated circuit as is known in the art capable of performing a specified electronic function. After testing the die 22 for bad die, the wafer may be placed on an adhesive film 44, referred to as a die attach film (DAF) tape, and then diced for example by saw or laser. The DAF tape may be formed of a die attach film adhered to a tape, and upon separation of the die from the tape, the film may remain affixed to a bottom surface of the die. The dicing process separates the wafer into individual semiconductor die 22, which remain affixed to the DAF tape. FIG. 2 shows wafer 40 affixed to a DAF tape 44.

In order to detach the individual die, the wafer and DAF tape are situated in a process tool, portions of which are shown in prior art FIG. 3. FIG. 3 shows a die ejector tool 50 including a vacuum chuck 52 on which is supported the wafer 40 and DAF tape 44. In order to lift the die off of the DAF tape 44, a pick-up tool 60 is provided including a vacuum tip 62. The pick-up tool 60 comes down over a die 22 to be removed from the DAF tape 44, the vacuum is applied to the tip 62, and the die 22 is pulled up off the tape 44. The pick-up tool then transports the die 22 for attachment to the substrate or for transport elsewhere.

FIG. 4 shows a bottom view of a conventional vacuum tip 62. The tip includes a plurality of vacuum holes 64, some of which are numbered in FIG. 4, for communicating the negative pressure to the surface of the vacuum tip 62. The negative pressure at the vacuum holes 64 hold the die 22 on the pick-up tool 60. In conventional vacuum tips, the vacuum holes 64 are uniformly distributed across the surface of the tip, for example as shown in FIG. 4.

One drawback to conventional vacuum tips is that, while the vacuum holes 64 exert a uniform pressure across the surface of a die to be lifted off of a DAF tape, the die is not peeled off from the DAF tape with a uniform pressure. In particular, during dicing of the wafer with a blade, the blade causes shear and normal forces near the edges of the die where it is cut. The shear and normal forces increase the adhesive force between the die and DAF tape near the edges of the die. These adhesive forces are a function of the distance, x, from the edges of a die, and decrease with a square of the distance away from the edge of a die. In one example, the adhesive force F(x) exerted by the DAF tape to the die is proportional to some constant, K, divided by a square of the distance, x, from the edge of the die:

$$F(x) \propto K/(1+x^2).$$

The constant, K, is the sum of different constants arising from the different mechanisms of adhesion. For example, chemical bonds occur between the adhesive and the dicing tape, which chemical bonds may be strengthened upon heating due to being cut with a blade or laser. Additionally, electrostatic forces may also result near the die edges as a result of the dicing. Further, van der Waals forces develop within the molecules of the DAF and the dicing tape.

Prior art FIG. 5 shows the upward forces $F_u$ on die 22 resulting from the vacuum tip 62, and the downward forces $F_d$ on die 22 resulting from the adhesion between the die 22 and DAF tape 44. As noted above, where the upward force of the vacuum tip is uniform, the downward force varies by a square of the distance away from the edge. Prior art FIG. 5 shows the net resultant forces $F_n$ on the die as a result of the upward forces $F_u$ and the downward forces $F_d$. As seen in FIG. 6, the net forces on die 22 are greater toward a middle of the die than at the edges.

The net result of this uneven force profile is that the die 22 may bend when being picked up by the vacuum tip 62 from the DAF tape in conventional die ejector tools. This scenario is shown in prior art FIG. 7. The bending of the die can have several harmful effects. The die may not be secure on the vacuum tip 62, and may fall off the tip 62. Moreover, the die may crack when it is bent, and/or the conductive traces formed on the surface of the semiconductor die 22 may get damaged when the die is bent or shift so as to electrically short against an adjacent conductive trace. This is especially true today, where the thicknesses of semiconductor die have been reduced in some examples to 40 or 50 microns (μm).

Even where no such damage occurs to the die, a further problem may occur when the bent die is mounted on a substrate, such as substrate 70 shown in prior art FIG. 8. Given the concave shape of the die 22 against the surface of the substrate 70, air bubbles 72 may form between the die and substrate. These air bubbles may cause the die to delaminate from the substrate, for example when the die and substrate are heated in the encapsulation process, due to the expansion of the air bubbles.

DETAILED DESCRIPTION

Figure 1:
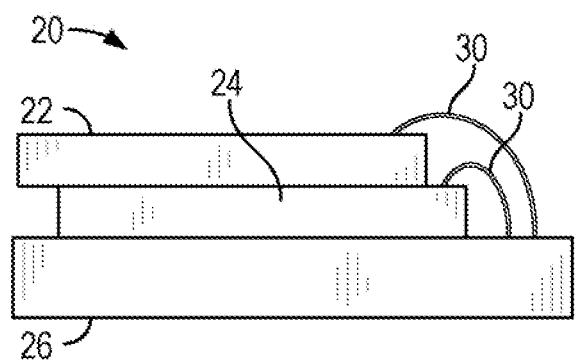
FIG. 1 is a prior art end view of a conventional semiconductor device.
Figure 2:
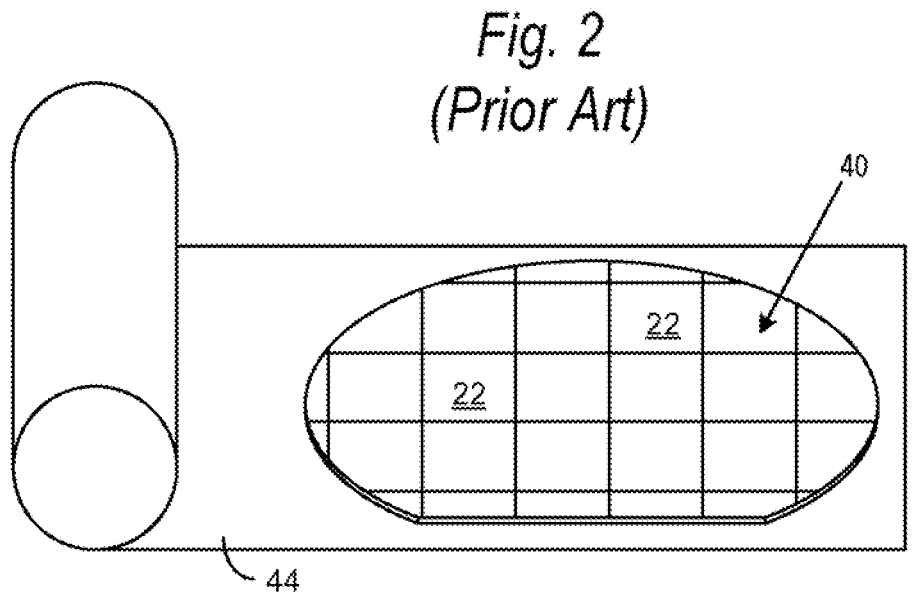
FIG. 2 is a prior art view of a semiconductor wafer mounted on a DAF tape.
Figure 3:
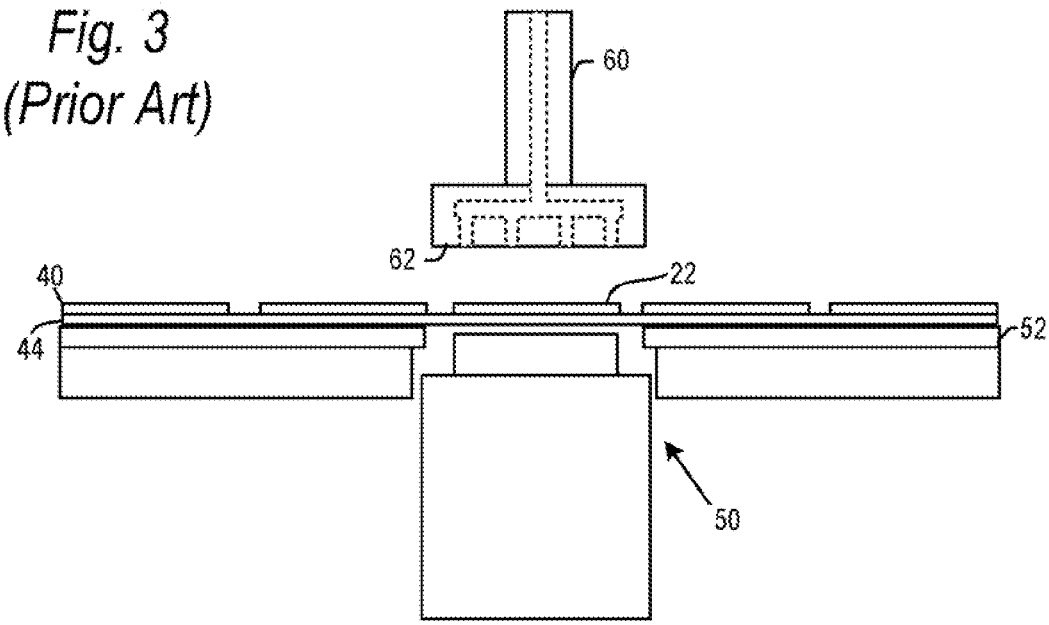
FIG. 3 is a prior art side view of a conventional ejector tool for separating the semiconductor die on a wafer from the DAF tape.

Embodiments will now be described with reference to FIGS. 9 through 26, which relate to a system and method of ejecting a die from an adhesive tape using a non-uniform vacuum force profile. In embodiments, the non-uniform vacuum force profile is created at a vacuum tip so that a relatively higher pickup force is exerted along the periphery of a semiconductor die as the vacuum tip pulls the die off of an adhesive tape. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Any reference herein to the terms "top" and "bottom" and "upper" and "lower," and derivations of these terms, are used herein for convenience and illustrative purposes only, and are not meant to limit the description of the semiconductor device inasmuch as the referenced item can be exchanged in position.

In general, embodiments relate to vacuum tip for a pick-up tool used in a die eject tool. The die eject tool is provided for removing a die from an adhesive tape assembly on which the diced wafer is supported, and transporting the die away from the wafer. While the adhesive tape assembly may be a DAF tape, it is understood that a variety of different tapes and tape assemblies used to hold a diced semiconductor wafer together in an ejector tool may be used.

The operation of an embodiment of the present system will now be described with reference to the flowchart of FIG. 9 and the views of FIGS. 10 through 26. Semiconductor die are formed on a wafer and tested in step 100. In step 102, the passive side of the wafer may undergo a backgrind process and then may be mounted on an adhesive tape, such as a DAF tape of known design. The wafer may then be diced into the individual semiconductor die in step 104. FIG. 10 shows a semiconductor wafer 200 including a plurality of diced die 204 mounted on an adhesive tape 206. In one example, the die 204 may be diced from wafer 200 so as to have a length of 12.96 mm, a width of 9.28 mm and a thickness of 46 µm. It is understood that these dimensions are by way of example only and may vary in alternative embodiments.

The adhesive tape 206 may be a DAF tape of a known construction and may contain a tape layer formed for example of polyester or the like laminated with an adhesive die attach film. One example of a DAF tape which may be used is EM-310VJ-P WEF, from Nitto Denko, Corporation, having headquarters in Osaka, Japan. Various known dicing techniques, such as for example sawing or laser cutting, may be used to cut the wafer into individual semiconductor die after the wafer is affixed to the DAF tape. Typical dicing processes leave a small kerf between adjacent die once mounted on the tape.

The tape and wafer may then be transferred to an ejector tool 220 (FIG. 11) in step 108 to remove the individual die. The ejector tool 220 may be similar to the ejector tool described in the Background section, or similar to any other known tool for removing diced semiconductor die from an adhesive tape, with the exception that the tool includes a novel vacuum tip 230. The wafer 200 and tape 206 are positioned on a support table 222 with the tape 206 lying against an upper surface of support table 222. Support table 222 may include a vacuum chuck for holding the tape 206 and wafer 200 securely thereon.

The ejector tool 220 may further include a pick-up tool 224 including a vacuum tip 230. The pick-up tool is mounted on a robotic arm which is controlled to pick respective die 204 off of the diced wafer 200, and transport the picked die elsewhere, such as for example onto a substrate as explained below. The vacuum tip 230 may be formed of a layer of rubber affixed to the pick-up tool 224, though the vacuum tip 230 may be formed of other materials in further embodiments.

Figure 12:
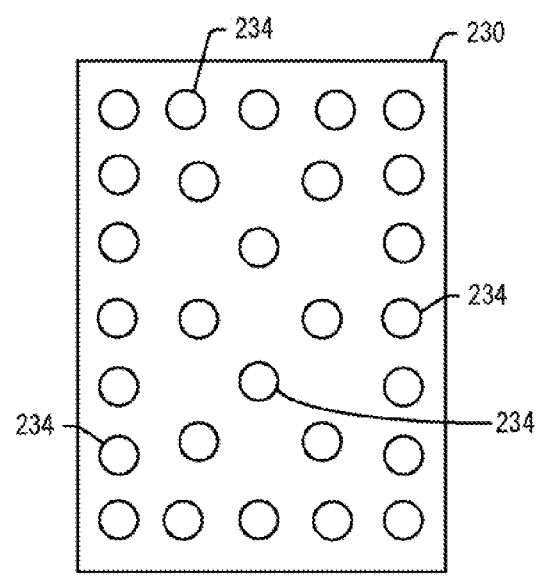
FIG. 12 is a bottom view of a vacuum tip according to an embodiment of the present invention.

As shown in FIG. 12, the vacuum tip 230 may include a plurality of vacuum holes 234 formed therein, some of which are numbered in FIG. 12. In accordance with aspects of the present technology, the vacuum holes 234 may be non-uniformly distributed across the surface of the vacuum tip 230. In particular, the holes 234 may be more dense toward the edges of the vacuum tip 230, and less dense toward the middle of the vacuum tip 230. This configuration of having a higher density of vacuum holes 234 toward the edges of the vacuum tip 230 results in a greater vacuum pickup force toward the edges of the vacuum tip 230.

Figure 12A:
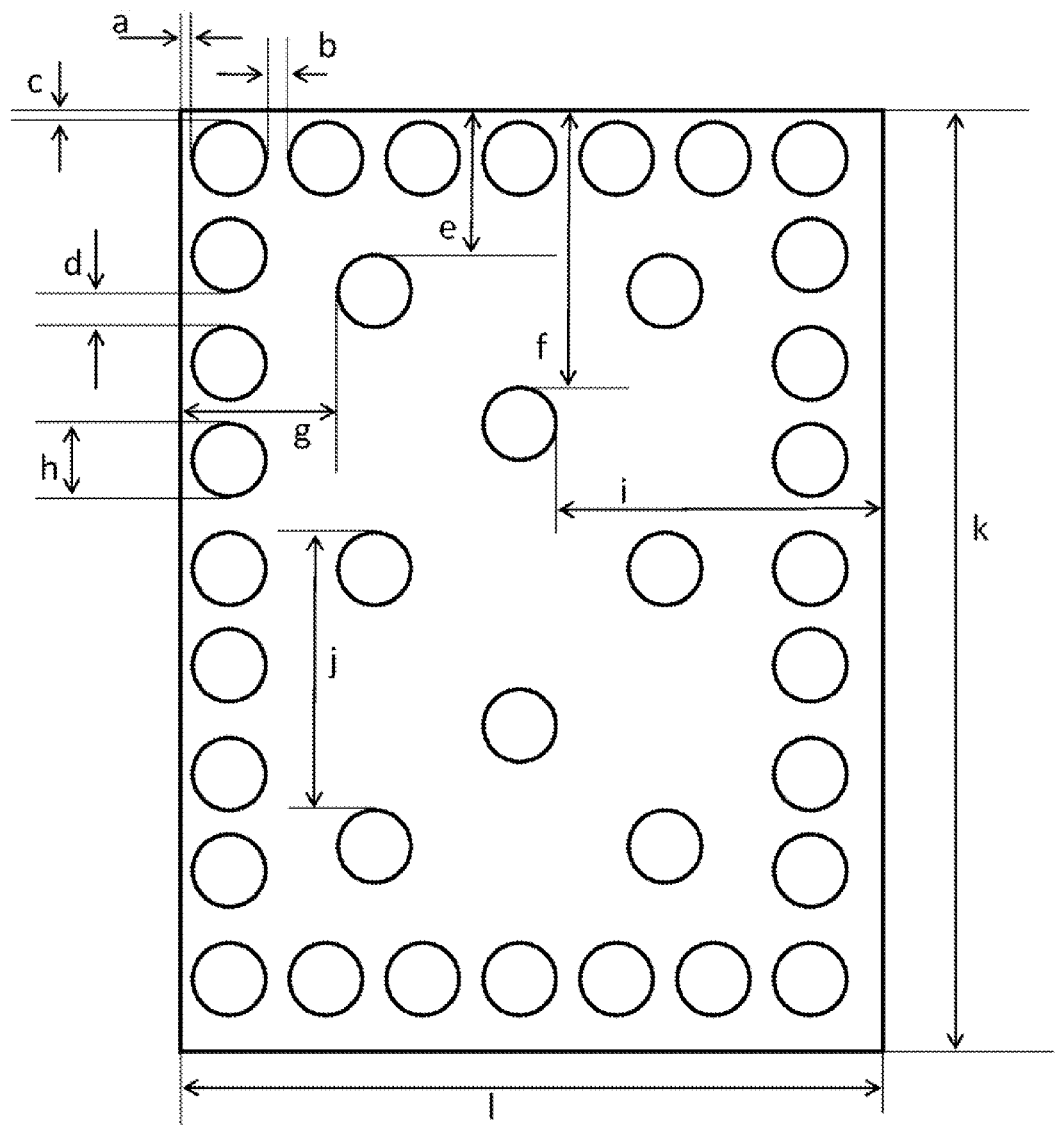
FIG. 12A is a bottom view of the vacuum tip of FIG. 12 with exemplary dimensions.

FIG. 12A is a view of the vacuum tip 230 of FIG. 12 with exemplary dimensions listed. In one, non-limiting example, the dimensions a through l on FIG. 12A may be as follows:
a.=523 µm
b.=386 µm
c.=494 µm
d.=469 µm
e.=2230 µm
f.=4000 µm
g.=2368 µm
h.=823 µm
i.=4237 µm
j.=3490 µm
k.=12371 µm
l.=9407 µm As indicated, each of these dimensions is by way of example only, and each may vary, proportionately or disproportionately to each other, in further embodiments.

The pick-up force exerted by a vacuum hole 234 on the die is equal to the pressure differential on the opposite sides of the die at a vacuum hole 234 multiplied by the area of the vacuum hole. The pressure on a first side of the die 204 lying against a vacuum hole may be the pressure in the vacuum holes 234, which may be about or near zero atmospheres. The pressure on a second side of the die opposite the first side may be atmospheric. Thus, in one example, the pressure differential at a vacuum hole 234 may be approximately atmospheric pressure.

The area of a vacuum hole is given by $\pi r^2$. Using the above example where the diameter (2r) of a vacuum hole 234 is 823 µm, the area of the vacuum hole 234 is 0.532 mm$^2$, or 0.000824 in$^2$.

From these values, the pick-up force of a single vacuum hole 234 in one example may be calculated. Using an example where the above-described pressure differential is about atmospheric pressure (14.7 lbs/in$^2$), and the area is 0.000824 in$^2$, then the pick-up force for a single vacuum hole may be 0.012 lbs. This value is an approximation and by way of example only. Each vacuum hole 234 provides this pick-up force. Given the dimensions shown on FIG. 12A, the forces exerted on the die 204 by all vacuum holes 234 may be calculated. As seen, the pick-up forces are higher at the edges of the die 204 than in the center given the higher density of vacuum holes 234 at the edges.

The holes 234 are each connected to a vacuum source (not shown). Thus, when the vacuum force is activated, a negative pressure is communicated to the holes 234. Areas on the vacuum tip 230 having a greater density of vacuum holes are able to exert a larger pickup force on the semiconductor die 204 held on the vacuum tip 230.

Figure 13:
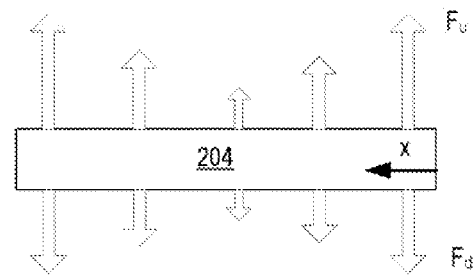
FIG. 13 illustrates the upward force profile through a cross-section of the die due to the vacuum force of an embodiment of the pick-up tool, and a downward force profile through the same cross-section of the die due to the adhesive forces of the die on the adhesive tape.
Figure 14:
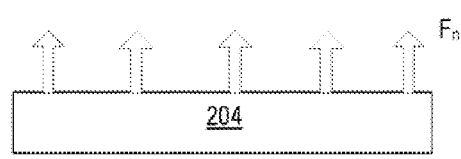
FIG. 14 illustrates the net forces resulting from the upward and downward forces of FIG. 13.

As shown in FIG. 13, the pattern of vacuum holes are provided so as to create an upward force profile $F_u$ through a cross-section of the die 204. The force profile $F_u$ is generally proportional to the downward force profile $F_d$ through the same cross-section of the die 204 due to the adhesion forces between the die 204 and tape 206. The upward and downward force profiles shown in FIG. 13 may be taken through any cross-section through the die 204, perpendicular to the major planar surfaces (upper and lower) of the die 204.

As noted in the Background section, the downward forces $F_d$ on the die 204 generally vary with a square of the distance, x, away from an edge: $F(x): K/(1+x^2)$ (other equations may alternatively be used to describe downward forces due to adhesion). In embodiments, the vacuum holes may be provided with a greater density toward the edges so that the upward forces $F_u$ may also vary with a square of the distance, x, away from an edge. This results in a net force provide $F_n$ shown in FIG. 14 that is uniform along the cross-section of the die 204. In this way, bending of the die, together with the accompanying problems, may be avoided.

In embodiments, the upward force profile is opposite and proportional to the adhesive force. However, while the adhesive force profile is generally continuous, the upward force profile is generally discontinuous. That is, the upward forces are exerted on the semiconductor die 204 by the vacuum holes 234, but not in between the vacuum holes 234. Thus, embodiments which describe the upward force profile as being opposite and proportional to the adhesive force may treat the upward force profile as being continuous by averaging out the discontinuities between vacuum holes.

In embodiments, the net force $F_n$ is uniform along any of various cross-sections of the die 204, such as for example along a length direction of the die 204, across a width dimension of the die 204, and along corner-to-corner diagonals of the die 204. In further embodiments, instead of the net force $F_n$ being consistently uniform across the die 204, the net force may vary slightly along the cross-section, but net force variations may be maintained within levels that will not cause bending of the die 204.

Figure 15:
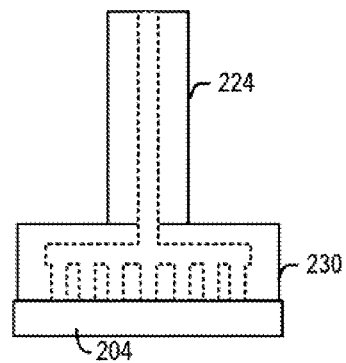
FIG. 15 shows a flat die supported on the pick-up tool of the present technology.
Figure 16:
FIG. 16 shows a flat die mounted on a substrate according to the present technology.
Figure 17:
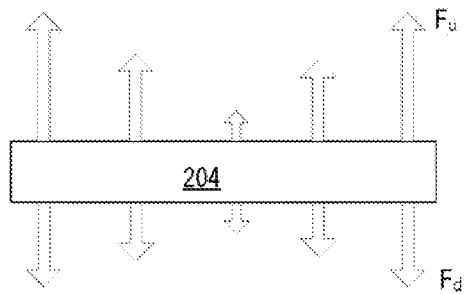
FIG. 17 illustrates the upward force profile through a cross-section of the die due to the vacuum force of an alternative embodiment of the pick-up arm, and a downward force profile through the same cross-section of the die due to the adhesive forces of the die on the adhesive tape.

Given the uniform net force $F_n$ across the die 204, the die may be gripped flatly against the vacuum tip 230 as shown in FIG. 15. Moreover, when the die is transported by the vacuum tip 230 to a substrate 250 as shown in FIG. 16, the die 204 may be mounted flat against the substrate 250 without trapping air bubbles between the die 204 and substrate 250. The die may then be mounted flat against the substrate, for example via a layer of die attach film (DAF) which remains on the die after the die is separated from the tape 206. Alternatively, a layer of epoxy may be used to attach the die to the substrate.

Referring again to FIGS. 12 and 13, it is understood that a variety of vacuum hole configurations may be provided in order to approximate an upward force profile $F_u$ where the force $F_u$ decreases proportionally to a square of the distance away from an edge. Some of these alternative embodiments are explained below with reference to FIGS. 20 through 25. In embodiments, the upward force $F_u$ for a given configuration of vacuum holes 234 may be empirically determined and tested to confirm it provides the desired upward force profile (varying with a square of the distance away from the edge). Where it is found that a given vacuum hole configuration does not result in a high enough upward force at the edges of the die (or test component), the density of the holes at the edges of the vacuum tip may be increased (or the density of holes at the center may be decreased).

Alternatively, a configuration of vacuum holes which are more dense nearer the edges of the vacuum tip 230 may be provided based on estimating a configuration that will be approximately proportionate to the downward force $F_d$ due to the adhesion between the die 204 and tape 206.

In further embodiments, it may happen that the downward forces $F_d$ do not vary with a square of the distance away from an edge of the die 204. In such embodiments, the vacuum holes 234 may be arranged in a configuration which provides an upward force profile $F_u$ which proportionately matches or nearly matches the downward force profile $F_d$. These force profiles may vary with the distance, x, from the edge of the die 201 by various functions f(x).

In the embodiments described above, the vacuum holes 234 are arranged so as to provide a net force profile $F_n$ which is generally uniform along the cross-section. However, in an alternative embodiment, the vacuum holes 234 may be arranged so as to provide a net force profile $F_n$ where the upward forces at the edges of the die 204 are greater than the upward forces toward a central area of the die 204. Such an embodiment is now described with reference to FIGS. 17 through 20.

Figure 18:
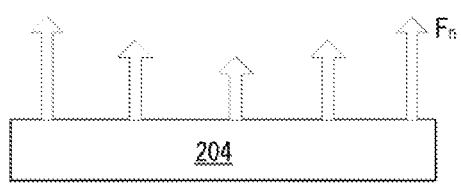
FIG. 18 illustrates the net forces resulting from the upward and downward forces of FIG. 17.

In the embodiment of FIGS. 17 through 20, the vacuum holes 234 are arranged in a way so that the upward force differentials at the edges of the die 204 relative to the center of the die are greater than the upward force differentials across the die in the embodiment of FIGS. 13 through 16. That is, the upward forces at the edges of the die 204 in FIGS. 17 through 20 may be higher than the upward forces at the edges of the die 204 in FIGS. 13 through 16. Alternatively, the upward forces at a center of the die 204 in FIGS. 17 through 20 may be lower than the upward forces at a center of the die 204 in FIGS. 13 through 16. The result is a net upward force profile $F_n$ as shown in FIG. 18 which has higher net upward forces at the edges of the die 204 in comparison to the net upward force at a center of the die.

Figure 19:
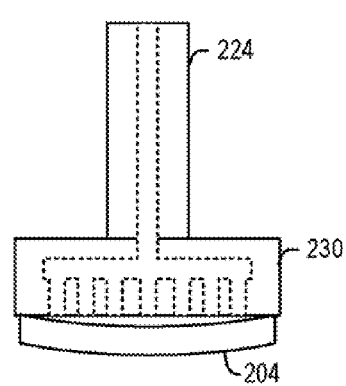
FIG. 19 shows a flat die supported on the pick-up arm of the present technology.
Figure 20:
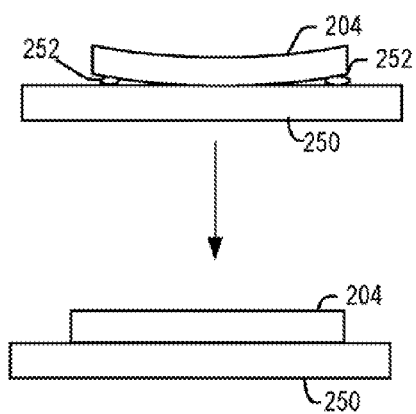
FIG. 20 shows a flat die mounted on a substrate according to the present technology.

This can result in a slight bending of the die when gripped on the vacuum tip 230 as shown in FIG. 19. In embodiments, the bend is slight so as not to jeopardize the hold of the die 204 on the vacuum tip 230 and so as not to risk breaking of the die. A die with a slight bend such as shown in FIG. 19 may be transported onto a substrate 250 as described above. The die in this embodiment may have a slight convex shape relative to the substrate, so that any air bubbles 252 that may exist between the die and substrate may freely be expelled out from the edges of the die 204 when the die 204 is pressed flat against the substrate as shown in the lower portion of FIG. 20.

Figure 21:
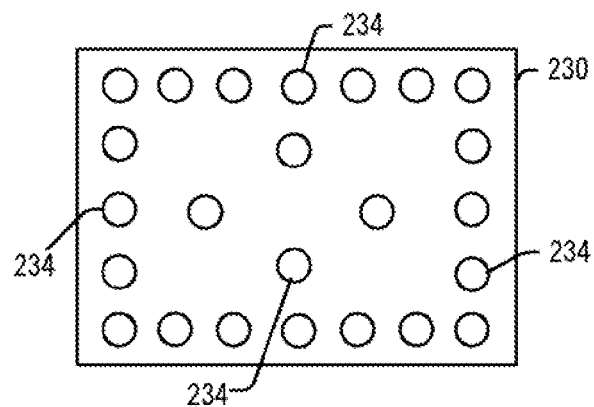
FIGS. 21-25 are bottom views of alternative configurations of a vacuum tip according to further embodiments of the present system.
Figure 22:
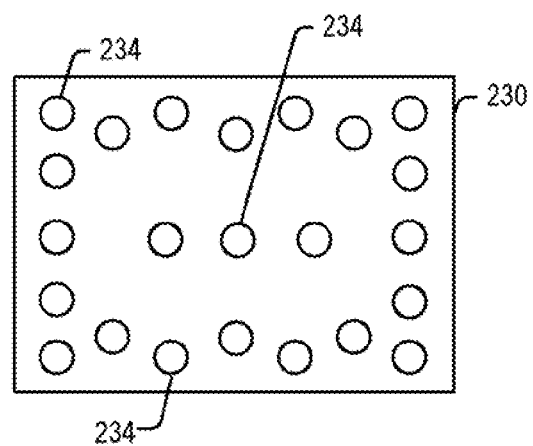
Figure 23:
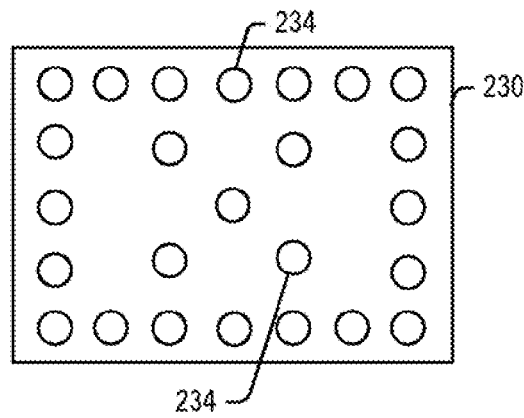

As noted above, different vacuum hole configurations may be provided. FIGS. 21 through 23 illustrate a few alternative configurations. These illustrations are not intended to be exhaustive, and many other configurations of vacuum holes 234 may be provided where the resulting upward forces at the edges of the vacuum tip 230 are higher than the upward forces resulting at the center of the vacuum tip.

Figure 4:
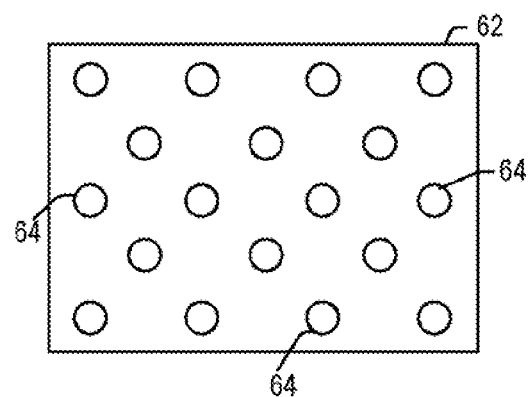
FIG. 4 is a prior art bottom view of a conventional vacuum tip in the pickup tool of FIG. 3.
Figure 5:
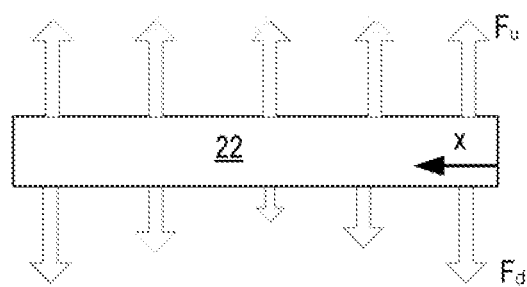
FIG. 5 illustrates the upward force profile through a cross-section of the die due to the vacuum force of the pick-up tool, and a downward force profile through the same cross-section of the die due to the adhesive forces of the die on the DAF tape.
Figure 6:
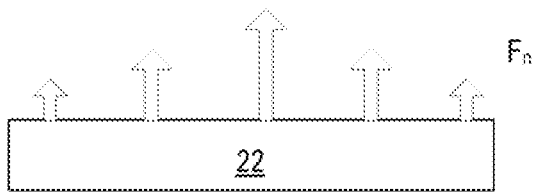
FIG. 6 illustrates the net forces resulting from the upward and downward forces of FIG. 5.
Figure 7:
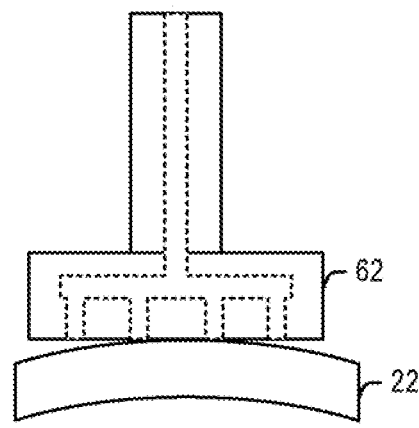
FIG. 7 shows a bent die on a pick-up tool with a conventional vacuum tip.
Figure 8:
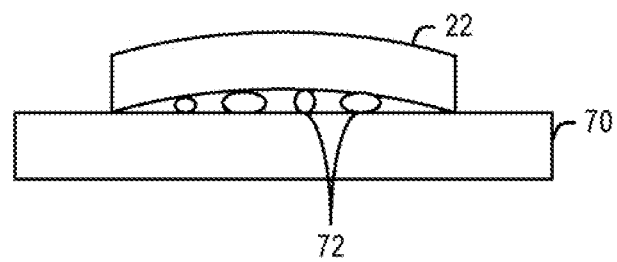
FIG. 8 shows a bent die picked up by a conventional vacuum tip mounted on a substrate.
Figure 24:
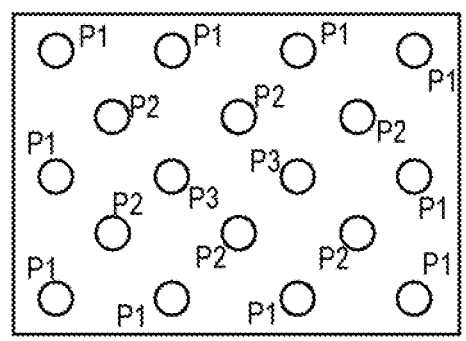

In the embodiments described above, a pressure differential which is higher at the edges is achieved by increasing the density of vacuum holes 234 nearer the edges. It is understood that the desired pressure differential across the surface of the vacuum tip 230 may be created other ways in further embodiments. For example, FIG. 24 shows an embodiment of a vacuum tip 230 having a uniform distribution of vacuum holes, such as that found in the prior art (FIG. 4). However, in this embodiment, different vacuum holes 234 are connected to different vacuum sources. In the example shown, a first group of vacuum holes 234 around an outer periphery of the vacuum tip 230 is connected to a vacuum source communicating a pressure P1 to the vacuum holes. A second group of vacuum holes 234 closer to the center of the vacuum tip 230 is connected to a vacuum source communicating a pressure P2 to the vacuum holes. And a third group of vacuum holes 234 even closer to the center of the vacuum tip 230 is connected to a vacuum source communicating a pressure P3 to the vacuum holes. In this example, the vacuum sources may be provided such that P1>P2>P3. The relative strengths of the vacuum sources may be controlled so as to create an upward force profile $F_u$ that is proportionate to the downward force profile $F_d$ so that the net force profile $F_n$ exerted across the die 204 is uniform.

Figure 25:
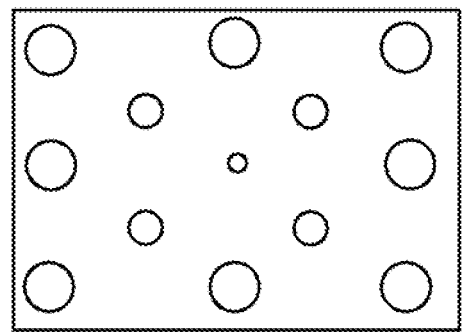

FIG. 25 illustrates a further example, again having a uniform distribution of vacuum holes 234, such as that found in the prior art (FIG. 4). However, in this embodiment, different vacuum holes 234 have different sizes. The holes near the outer periphery may have a larger diameter than the holes at the center of the vacuum tip 230. The larger holes at the outer periphery may be able to exert a greater upward force on the die than the smaller holes at the center. This can create an upward force profile $F_u$ that has higher forces at the edges of the die so that the net force profile exerted across the die 204 is uniform.

Figure 9:
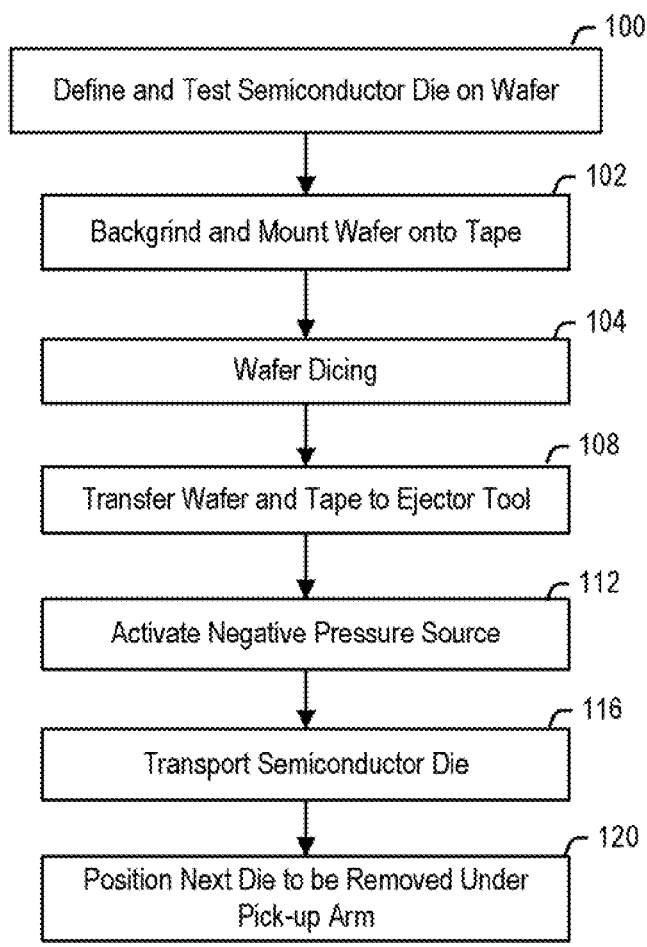
FIG. 9 is a flowchart showing operation of an embodiment of the present technology.
Figure 10:
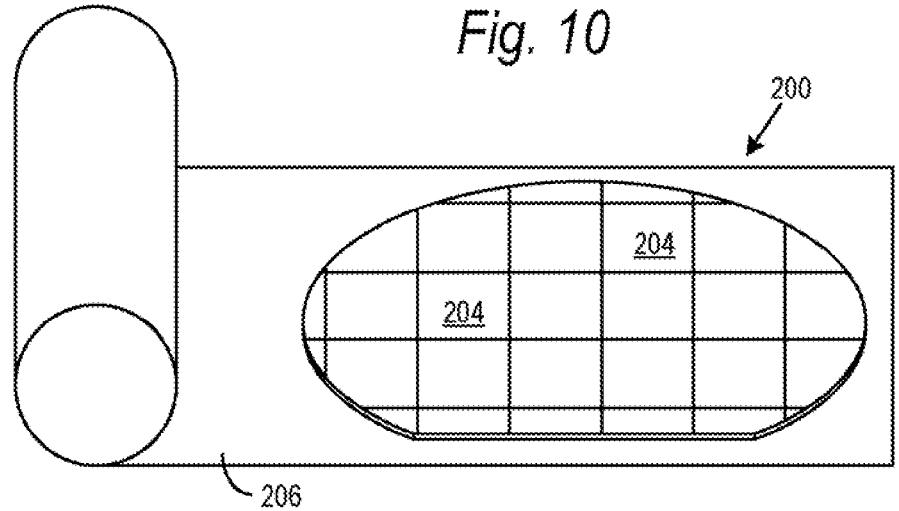
FIG. 10 is a top view of a semiconductor wafer mounted on an adhesive tape according to embodiments of the present system.
Figure 11:
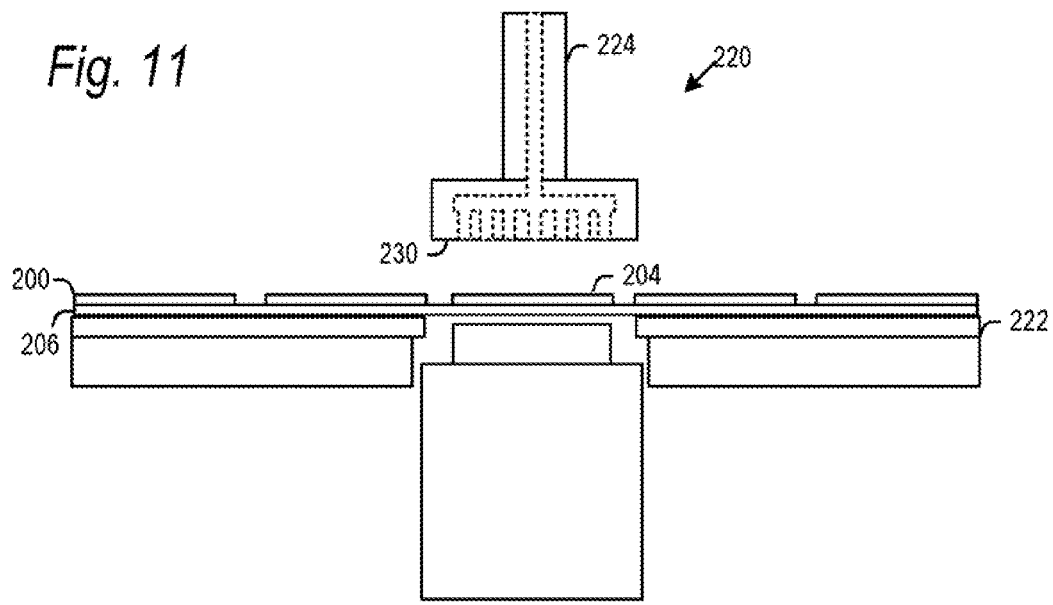
FIG. 11 is a view of an ejector tool according to embodiments of the present technology.

Referring again to the flowchart of FIG. 9, before or after the vacuum tip 230 is brought against a die to be removed, the vacuum source may be activated in step 112, and the die may be removed and transported in step 116. After the transported die is deposited elsewhere, the pick-up tool 224 may return to the wafer to pick up the next die 204 as indicated in step 120.

Figure 26:
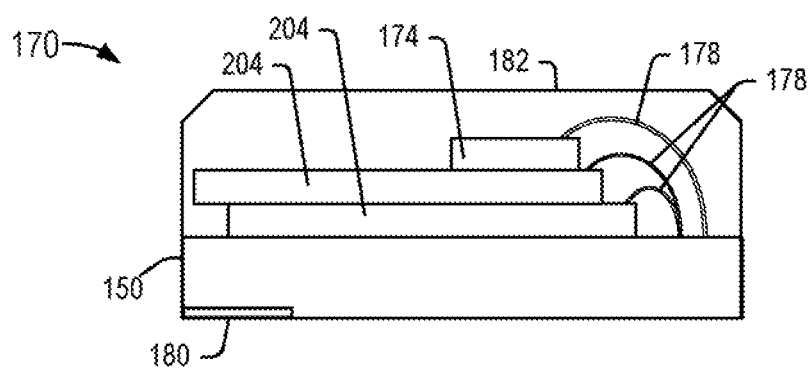
FIG. 26 is a side view of a finished semiconductor package including semiconductor die formed by the present system.

FIG. 26 illustrates a semiconductor package 170 assembled using semiconductor die ejected by the above-described system. The semiconductor package 170 includes one or more of die 204. These die may be for example non-volatile memory coupled with a controller die 174 such as for example an ASIC. Other types of die are contemplated. The die are electrically coupled to a substrate 150, for example via wire bonds 178. Passive components (not shown) may further be mounted on the substrate 150. The package 170 may for example be a land grid array (LGA) package which may be removably inserted into and removed from a host device. In such an embodiment, the substrate may include contact fingers 180 on a lower surface of the package for mating with terminals in the host device. The package may be encapsulated in a molding compound 182 to protect the semiconductor die and other components against shock and moisture.

Using the above-described system and method, the forces exerted by the vacuum tip relative to the forces of adhesion may be balanced, and a uniform net force distribution may be provided. This in turn may reduce yield failures due to die cracking, conductive trace damage and shorting, and/or die delamination on the substrate.

In general, the present technology may relate to a tool for separating a semiconductor die from a tape assembly, the tool comprising: a vacuum tip having a plurality of vacuum holes in a surface of the vacuum tip for exerting a force on a surface of the semiconductor die opposite a surface of the semiconductor die engaged by the tape, the plurality of vacuum holes having a non-uniform distribution across the surface of the vacuum tip.

In another example, the present technology relates to a tool for separating a semiconductor die from a tape assembly, the tool comprising: a vacuum tip having a plurality of vacuum holes in a surface of the vacuum tip for exerting a force on a surface of the semiconductor die opposite a surface of the semiconductor die engaged by the tape, the plurality of vacuum holes exerting a force on the semiconductor die that is larger at edges of the semiconductor die than in a center of the semiconductor die.

In a further example, the present technology relates to a tool for separating a semiconductor die from a tape assembly, the tape assembly exerting non-uniform forces on the semiconductor die, the non-uniform forces larger at edges of the semiconductor die than at a center of the semiconductor die, the tool comprising: a support surface for supporting the semiconductor die, a first surface of the semiconductor die including the tape facing the support surface; and a vacuum tip having a plurality of vacuum holes in a surface of the vacuum tip for receiving a low pressure exerting a force on a second surface of the semiconductor die opposite the first surface of the semiconductor die engaged by the tape, the plurality of vacuum holes exerting a force on the semiconductor die to offset the non-uniform forces of the tape assembly on the semiconductor die.

The foregoing detailed description has been presented for purposes of illustration and description. It is not intended to be exhaustive or to limit the description to the precise form disclosed. Many modifications and variations are possible in light of the above teaching. The described embodiments were chosen in order to best explain the principles of the claimed system and its practical application to thereby enable others skilled in the art to best utilize the claimed system in various embodiments and with various modifications as are suited to the particular use contemplated. It is intended that the scope of the method be defined by the claims appended hereto.

We claim:

1. A tool for separating a semiconductor die from a tape assembly, the tape assembly exerting larger forces around an outer periphery of the semiconductor die than toward a center of the semiconductor die, the tool comprising:
a vacuum tip having a first plurality of vacuum holes in a central area of a surface of the vacuum tip for exerting a first force toward the center of the semiconductor die, on a surface of the semiconductor die opposite a surface of the semiconductor die engaged by the tape, and the vacuum tip having a second plurality of vacuum holes in an outer periphery area, nearer the edges of the surface than the central area, for exerting a second force around the outer periphery of the semiconductor die, on the surface of the semiconductor die, the second plurality of holes being more closely spaced from each other than the first plurality of holes so that the second force is greater than the first force, the second force counteracting the greater forces of the tape assembly around the outer periphery of the semiconductor die, and the first force counteracting the lesser forces of the tape assembly toward the center of the semiconductor die so that the semiconductor die remains substantially flat when the vacuum tip lifts the semiconductor die off the tape assembly.

2. The tool recited in claim 1, wherein adhesive forces between the semiconductor die and the tape assembly define a first force profile across a surface of the semiconductor die, a low pressure communicated to the plurality of vacuum holes defining a second force profile in an opposite direction than the first force profile, the net force profile between the first and second force profiles resulting in a force profile that is larger at edges of the semiconductor die than in a center of the semiconductor die.

3. The tool recited in claim 1, wherein the plurality of vacuum holes are provided in a configuration where the vacuum holes provide a vacuum force on the die which decreases proportionally to a square of the distance away from an edge.

4. The tool recited in claim 1, wherein adhesive forces between the semiconductor die and the tape assembly define a first force profile across a surface of the semiconductor die, a low pressure communicated to the plurality of vacuum holes defining a second force profile in an opposite direction than the first force profile, the net force profile between the first and second force profiles resulting in a uniform force profile across the surface of the semiconductor die.

5. The tool recited in claim 4, the first and second profiles varying proportionally to a square of the distance from an edge of the semiconductor die.

* * * * *